(12) United States Patent
Noda

(10) Patent No.: US 12,094,566 B2
(45) Date of Patent: Sep. 17, 2024

(54) MEMORY SYSTEM

(71) Applicant: KIOXIA CORPORATION, Tokyo (JP)

(72) Inventor: Junichiro Noda, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 206 days.

(21) Appl. No.: 17/899,442

(22) Filed: Aug. 30, 2022

(65) Prior Publication Data
US 2023/0197125 A1 Jun. 22, 2023

(30) Foreign Application Priority Data

Dec. 16, 2021 (JP) ................. 2021-203994

(51) Int. Cl.
*G11C 7/10* (2006.01)
(52) U.S. Cl.
CPC ................. *G11C 7/1084* (2013.01)
(58) Field of Classification Search
CPC ...... G11C 7/1084; G11C 7/1048; G11C 5/063
USPC .................................. 365/189.05
See application file for complete search history.

(56) References Cited

U.S. PATENT DOCUMENTS

| | | | |
|---|---|---|---|
| 5,821,767 A | 10/1998 | Osaka et al. | |
| 8,274,850 B2 | 9/2012 | Koshizuka | |
| 2021/0303014 A1* | 9/2021 | Migliavacca | ........... G05F 1/575 |

FOREIGN PATENT DOCUMENTS

| | | |
|---|---|---|
| JP | 3407469 B2 | 5/2003 |
| JP | 2010-170296 A | 8/2010 |
| JP | 2016-031627 A | 3/2016 |

* cited by examiner

*Primary Examiner* — Huan Hoang
(74) *Attorney, Agent, or Firm* — Kim & Stewart LLP

(57) ABSTRACT

A memory system includes a controller, a plurality of memory devices, and a signal wiring. The signal wiring is connected between the controller and the volatile memory devices and configuring a fly-by topology. At least one of the memory devices includes a memory cell array, a processing circuit configured to control the memory cell array, an input buffer through which a signal from the controller is transmitted to the processing circuit, and a resistor circuit connected between the input buffer and the signal wiring. The resistor circuit has a resistance value corresponding to a parasitic capacitance of the input buffer.

20 Claims, 8 Drawing Sheets

MEMORY SYSTEM

CROSS-REFERENCE TO RELATED APPLICATION(S)

This application is based upon and claims the benefit of priority from Japanese Patent Application No. 2021-203994, filed Dec. 16, 2021, the entire contents of which are incorporated herein by reference.

FIELD

Embodiments described herein relate generally to a memory system.

BACKGROUND

There is a memory system including a memory device, and a controller that controls the memory device. In the memory system, the controller and the memory device are connected to each other. In the memory system, it is preferable that a signal is effectively transmitted from the controller to the memory device.

DETAILED DESCRIPTION

Embodiments provide a memory system that can effectively transmit a signal from a controller to a memory device.

In general, according to an embodiment, a memory system includes a controller, a plurality of memory devices, and a signal wiring. The signal wiring is connected between the controller and the volatile memory devices and configuring a fly-by topology. At least one of the memory devices includes a memory cell array, a processing circuit configured to control the memory cell array, an input buffer through which a signal from the controller is transmitted to the processing circuit, and a resistor circuit connected between the input buffer and the signal wiring. The resistor circuit has a resistance value corresponding to a parasitic capacitance of the input buffer.

A memory system according to one or more embodiments is described in detail with reference to the accompanying drawings below. The present disclosure is not limited to these embodiments.

Embodiment

A memory system according to an embodiment includes a wiring structure of a fly-by topology (may be referred to as a fly-by wiring structure) in which a controller and memory devices are connected to each other. According to the embodiment, a signal is effectively transmitted from the controller to the memory device via the fly-by wiring structure. For example, as illustrated in FIG. 1, a memory system 1 can be connected to a host 100 via a communication medium 200 and can function as an external storage medium with respect to the host 100.

Figure 1:
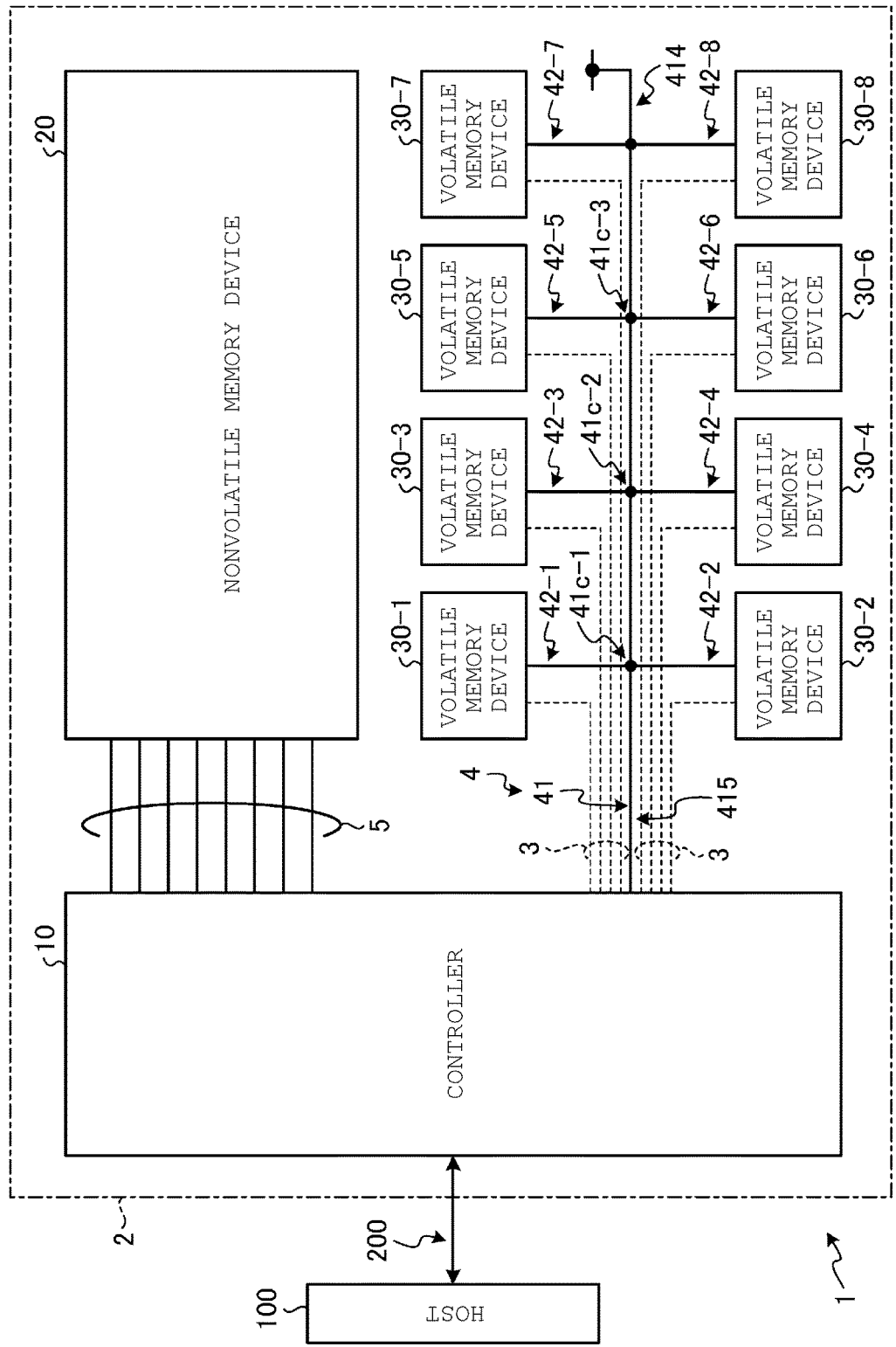
FIG. 1 is a diagram illustrating a configuration of a memory system according to an embodiment.

FIG. 1 is a diagram illustrating a configuration of the memory system 1. The host 100 is, for example, a personal computer, and the memory system 1 is, for example, a solid-state drive (SSD). The memory system 1 includes a substrate 2, a controller 10, a nonvolatile memory device 20, a plurality of volatile memory devices 30-1 to 30-8, and bus wirings 3, 4, and 5.

The controller 10, the nonvolatile memory device 20, the plurality of volatile memory devices 30-1 to 30-8, and the bus wirings 3, 4, and 5 are mounted on the substrate 2. The substrate 2 includes, for example, a printed circuit board (PCB).

The bus wiring 5 connects the controller 10 and a plurality of terminals of the nonvolatile memory device 20. The bus wiring 5 has a parallel wiring structure and includes a plurality of lines that connect the controller 10 and the plurality of terminals of the nonvolatile memory device 20 to each other in parallel. The plurality of lines are also used as data lines, address lines, or control signal lines.

The bus wiring 3 connects the controller 10 and the plurality of volatile memory devices 30-1 to 30-8. The bus wiring 3 has a parallel wiring structure and includes a plurality of lines that connect the controller 10 and the plurality of volatile memory devices 30-1 to 30-8 to each other in parallel. The plurality of lines are respectively used as data lines.

The bus wiring 4 connects the controller 10 and the plurality of volatile memory devices 30-1 to 30-8 independently from the bus wiring 3. The bus wiring 4 includes a fly-by wiring structure. The bus wiring 4 includes a main line 41 and a plurality of branch lines 42-1 to 42-8. The main line 41 is connected to the controller 10. The plurality of branch lines 42-1 to 42-8 are branched and connected to the main line 41, respectively. The plurality of branch lines 42-1 to 42-8 correspond to the plurality of volatile memory devices 30-1 to 30-8, respectively. The branch lines 42 are connected to the corresponding volatile memory devices 30, respectively. The main line 41 and the plurality of branch lines 42-1 to 42-8 are used as address lines or control signal lines.

Figure 2:
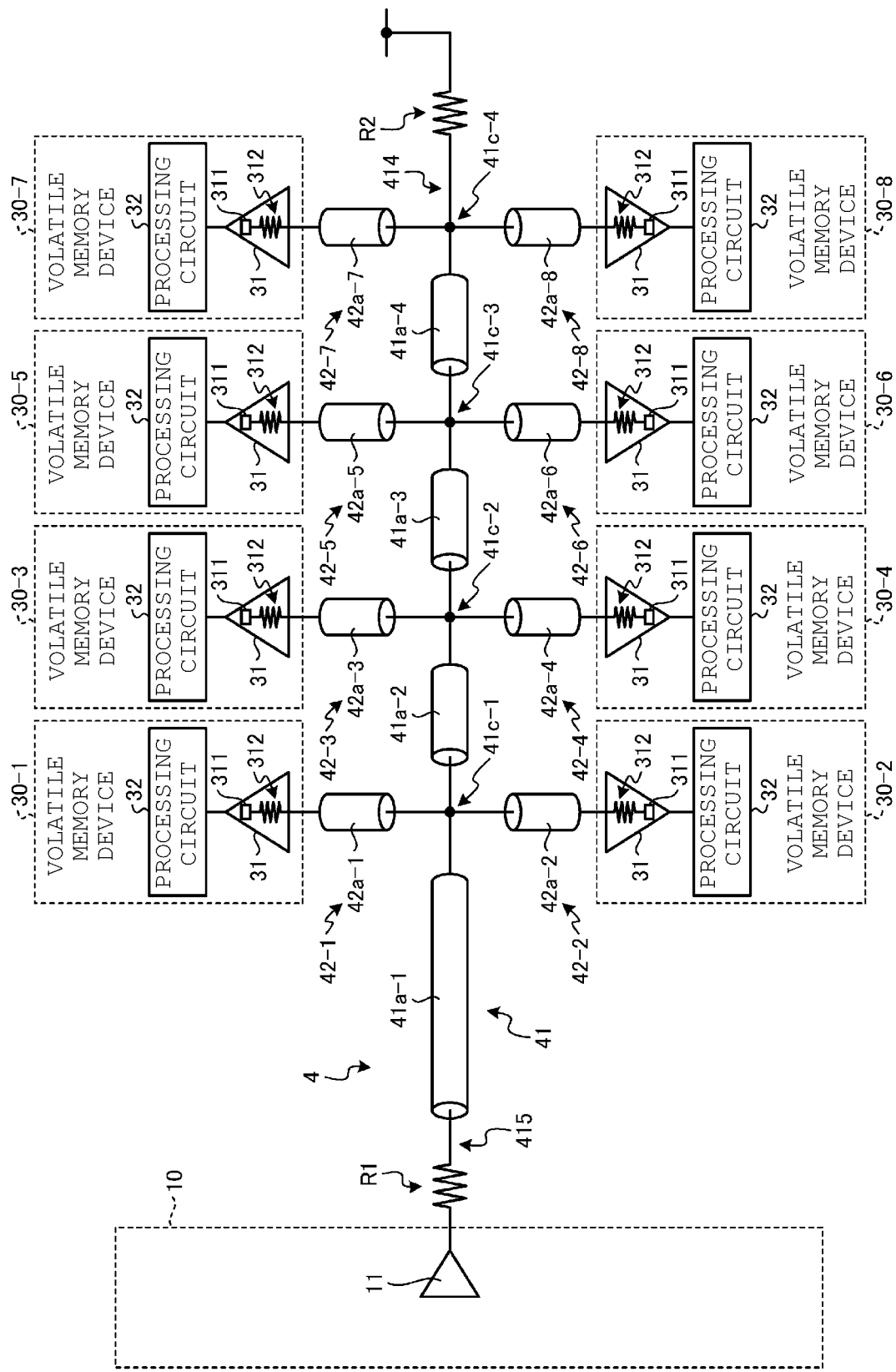
FIG. 2 is a diagram illustrating a connection configuration between a controller and a plurality of volatile memory devices in the memory system according to the embodiment.

The main line 41 includes a first end that is connected to the controller 10 and a second end that is connected to a node 414 (see FIG. 2). The main line 41 includes nodes 41c-1 to 41c-4 between the first end and the second end.

The branch line 42-1 includes a first end that is connected to the node 41c-1 and a second end that is connected to the volatile memory device 30-1. The branch line 42-2 includes a first end that is connected to the node 41*c*-1 and a second end that is connected to the volatile memory device 30-2. The branch line 42-3 includes a first end that is connected to the node 41*c*-2 and a second end that is connected to the volatile memory device 30-3. The branch line 42-4 includes a first end that is connected to the node 41*c*-2 and a second end that is connected to the volatile memory device 30-4. The branch line 42-5 includes a first end that is connected to the node 41*c*-3 and a second end that is connected to the volatile memory device 30-5. The branch line 42-6 includes a first end that is connected to the node 41*c*-3 and a second end that is connected to the volatile memory device 30-6. The branch line 42-7 includes a first end that is connected to the node 41*c*-4 and a second end that is connected to the volatile memory device 30-7. The branch line 42-8 includes a first end that is connected to the node 41*c*-4 and a second end that is connected to the volatile memory device 30-8.

As illustrated in FIG. 2, the main line 41 can be equivalently regarded as a series connection of a plurality of stubs 41*a* (41*a*-1 to 41*a*-4), and the plurality of branch lines 42-1 to 42-8 can be equivalently regarded as stubs 42*a* (42*a*-1 to 42*a*-8), respectively. FIG. 2 is a diagram illustrating a connection configuration between the controller 10 and the plurality of volatile memory devices 30. Each of the stubs 41*a*-1 to 41*a*-4 and 42*a*-1 to 42*a*-8 can be equivalently regarded as a circuit including an inductive element and a capacitive element and has an impedance.

Although details will be described below, each of the volatile memory devices 30-1 to 30-8 includes an input circuit 31 and a processing circuit 32. The input circuit 31 includes a resistor circuit 312 and an input buffer 311. The controller 10 includes a driver 11.

Here, in the memory system 1 illustrated in FIG. 1, while keeping the substrate 2 compact, a mounting area of the nonvolatile memory device 20 is widely allocated, so that a cost per storage capacitance as the storage can be reduced. In this case, mounting areas of the plurality of volatile memory devices 30-1 to 30-8 on the substrate 2 are required to be kept in the area limited on the substrate 2.

The main line 41 is relatively longer than the branch lines 42 and thus has more locations to dispose circuit elements thereon. For that reason, as illustrated in FIG. 2, while the requirement of the limited area is satisfied, resistors R1 and R2 can be located on the main line 41.

A node between the resistor R1 and the stub 41*a* closest to the controller 10 is referred to as a node 415. The resistor R1 is electrically connected between the driver 11 in the controller 10 and the stub 41*a*. The resistor R1 has a resistance value (for example, about 30Ω) corresponding to the impedance substantially equal to an impedance on the node 415 side. Accordingly, the main line 41 can be terminated on the node 415 side, and the reflection on the node 415 side can be prevented during the signal transmission.

A node between the resistor R2 and the stub 41*a* farthest from the controller 10 is referred to as the node 414. The resistor R2 is electrically connected between the node 414 and the power supply voltage. The resistor R2 has a resistance value (for example, about 30Ω) corresponding to the impedance substantially equal to an impedance on the node 414 side. Accordingly, the main line 41 can be terminated on the node 41*c*-4 side, and the reflection on the node 41*c*-4 side can be prevented during the signal transmission.

Meanwhile, the branch lines 42-1 to 42-8 are relatively shorter than the main line 41 and thus has limited location to dispose circuit elements thereon. For that reason, the resistor circuit 312 is located in each of the volatile memory devices 30-1 to 30-8. The resistor circuit 312 is located between the branch line 42 and the input buffer 311 in the volatile memory device 30. The resistor circuit 312 has a resistance value in accordance with an input parasitic capacitance of the input buffer 311. Accordingly, the resistor circuit 312 can function as a damping resistor. Accordingly, a reflected wave at an input node of the input buffer 311 during the signal transmission can be attenuated by the resistor circuit 312.

Figure 3:
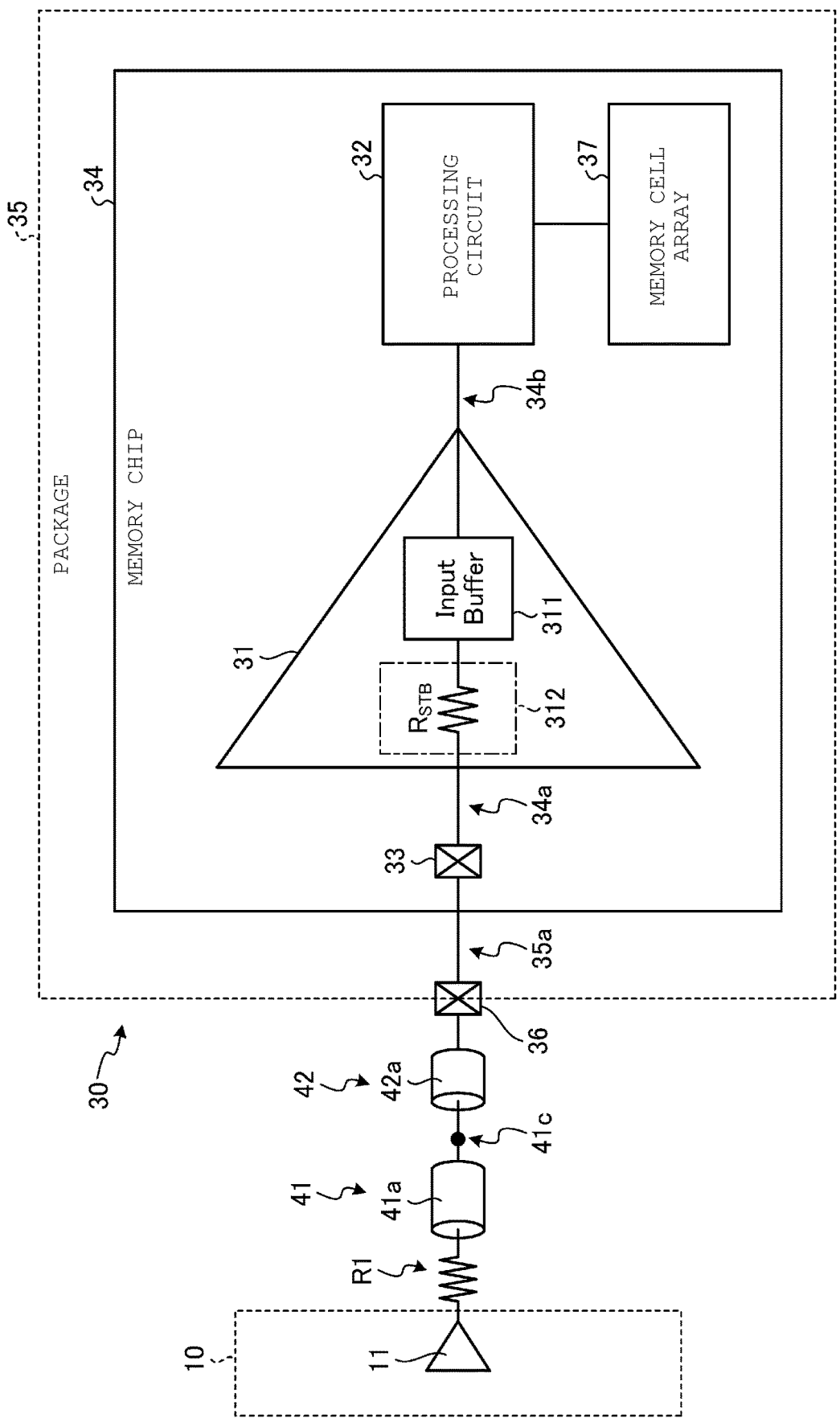
FIG. 3 is a diagram illustrating a configuration of the volatile memory device according to the embodiment.

As illustrated in FIG. 3, the volatile memory devices 30 include a memory chip 34, a package 35, and a terminal 36, respectively. The memory chip 34 includes the input circuit 31, the processing circuit 32, a memory cell array 37, and an electrode 33. FIG. 3 is a diagram illustrating a configuration of the volatile memory device 30.

The package 35 accommodates the memory chip 34 and includes the terminal 36 that can be externally connected. The terminal 36 is connected to the driver 11 in the controller 10 via the branch line 42, the main line 41, and the resistor R1. Equivalently, the terminal 36 is connected to the driver 11 in the controller 10 via the stub 42*a*, the stub 41*a*, and the resistor R1. In addition, the terminal 36 is connected to the electrode 33 mounted on the memory chip 34 via a package wiring 35*a*. The package wiring 35*a* is, for example, a bonding wire or a ball electrode.

In addition to the electrode 33, a line 34*a*, the input circuit 31, a line 34*b*, the processing circuit 32, and the memory cell array 37 are mounted on the memory chip 34. The input circuit 31 includes the resistor circuit 312 and the input buffer 311. The line 34*a* is located between the electrode 33 and the input buffer 311, and electrically connects the electrode 33 and the input buffer 311. The resistor circuit 312 includes a resistor $R_{STB}$. The resistor $R_{STB}$ is located on the line 34*a*, and includes a first end that is electrically connected to the electrode 33 and a second end that is electrically connected to the input node of the input buffer 311. The line 34*b* is located between the input buffer 311 and the processing circuit 32, and electrically connects the input buffer 311 and the processing circuit 32. The processing circuit 32 is connected to the memory cell array 37 and can control the memory cell array 37. The lines 34*a* and 34*b* are mounted on the memory chip 34, as line patterns and/or plugs, respectively. An input impedance of the input buffer 311 can be equivalently regarded as an impedance due to an input parasitic capacitance.

For example, if a signal is transmitted from the driver 11, the traveling wave of the signal reaches the input node of the input buffer 311 via the resistor R1, the stub 41*a*, a branch point 41*c*, the stub 42*a*, the terminal 36, the package wiring 35*a*, the electrode 33, the line 34*a*, and the resistor circuit 312. Thereafter, the signal is reflected at the input node of the input buffer 311. The reflected wave of the signal travels in a direction opposite to the traveling direction of the traveling wave from the input node of the input buffer 311, and the power is attenuated by the resistor circuit 312. The resistance value of the resistor circuit 312 is set to a value in a certain range so that the power of the reflected wave can be attenuated to an allowable range. The certain range is a range in accordance with the input parasitic capacitance of the input buffer 311. The certain range is a range in which waveform qualities of the combined waves including traveling waves and reflected waves satisfy specifications, for example, a range in which the minimum opening amplitude of the eye pattern of the combined waves satisfies the required level.

A lower limit of the range of the resistance value of the resistor circuit 312 can be, for example, set to a resistance value that causes the voltage amplitude of the reflected wave to be attenuated to ¹⁄₁₀ of the voltage amplitude of the traveling wave. If the voltage amplitude of the traveling wave is set as Vi, the voltage amplitude of the reflected wave is set as Vo, the input parasitic capacitance of the input buffer 311 is set as C, the resistance value of the resistor circuit 312 is set as R, and the average frequency of the traveling waves and the reflected waves is set as f, Expression 1 is satisfied.

$$Vo/Vi=1/\{\sqrt{(1+(2\pi fCR)^2)}\} \quad \text{Expression 1}$$

If the voltage amplitude of the reflected wave is ¹⁄₁₀ of the voltage amplitude of the traveling wave, Expression 2 is satisfied.

$$Vo/Vi=1/10 \quad \text{Expression 2}$$

If Expression 1 is substituted into Expression 2 to solve R, Expression 3 is obtained.

$$R=\sqrt{(100-1)}/(2\pi fC) \quad \text{Expression 3}$$

With respect to an average frequency f of the traveling waves and the reflected waves, round-trip time $T_{STB}$ of the traveling waves and the reflected waves can be approximately regarded as a cycle corresponding thereto, and thus Expression 4 is satisfied.

$$f=1/T_{STB} \quad \text{Expression 4}$$

If Expression 4 is substituted into Expression 3 to solve R, and R is replaced with $R_{MIN}$, Expression 5 is obtained. Expression 5 represents a lower limit of the range of the resistance value of the resistor circuit 312.

$$R_{MIN}=\sqrt{\{(100-1)/(2\pi C/T_{STB})\}} \quad \text{Expression 5}$$

For example, if C=0.5 pF, and $T_{STB}$=40 ps are substituted into Expression 5, $R_{MIN}$≈127Ω is satisfied.

An upper limit of the range of the resistance value of the resistor circuit 312 may be, for example, set to a resistance value so that the time constant by the input parasitic capacitance of the input buffer 311 does not exceed ¼ of 1 unit interval (UI). 1 UI is a unit period of the waveform process of a signal by the processing circuit 32. If the unit period of the waveform process of the signal is set as $T_{UI}$, when the time constant by the input parasitic capacitance of the input buffer 311 is set as ¼ of the period of 1 UI, Expression 6 is satisfied.

$$R \times C = T_{UI} \times 1/4 \quad \text{Expression 6}$$

If Expression 6 is solved for R, and R is replaced with $R_{MAX}$, Expression 7 is obtained. Expression 7 represents the upper limit of the range of the resistance value of the resistor circuit 312.

$$R_{MAX}=T_{UI}/(4C) \quad \text{Expression 7}$$

For example, if C=0.5 pF, and $T_{UI}$=1,072 ps are substituted into Expression 7, $R_{MAX}$≈500Ω is satisfied.

The range with respect to a resistance value R of the resistor circuit 312 is shown in Expression 8.

$$R_{MIN}<R<R_{MAX} \quad \text{Expression 8}$$

If Expression 5 and Expression 7 are substituted into Expression 8, Expression 9 is obtained.

$$\sqrt{\{(100-1)/(2\pi C/T_{STB})\}}<R<T_{UI}/(4C) \quad \text{Expression 9}$$

The resistance value R of the resistor circuit 312 corresponds to the resistance of the resistor $R_{STB}$ in the resistor circuit 312.

For example, if the round-trip time of the traveling waves and the reflected waves in the branch line 42-1 is set as $T_{STB1}$, the input parasitic capacitance of the input buffer 311 of the volatile memory device 30-1 is set as $C_1$, and the unit period of the waveform process of the signal is set as $T_{UI}$, the resistor circuit 312 of the volatile memory device 30-1 is configured so that a resistance value $R_1$ thereof satisfies Expression 10.

$$\sqrt{[(100-1)/\{(2\pi C_1(1/T_{STB1}))\}]}<R_1<T_{UI}/(4C_1) \quad \text{Expression 10}$$

In addition, the volatile memory device 30-1 is a volatile memory device closest to (at the near end of) the controller 10 among the plurality of volatile memory devices 30-1, 30-3, 30-5, and 30-7.

If the round-trip time of the traveling waves and the reflected waves in the branch line 42-2 is set as $T_{STB2}$, and the input parasitic capacitance of the input buffer 311 of the volatile memory device 30-2 is set as $C_2$, the resistor circuit 312 of the volatile memory device 30-2 is configured so that a resistance value $R_2$ thereof satisfies Expression 11.

$$\sqrt{[(100-1)/\{2\pi C_2(1/T_{STB2})\}]}<R_2<T_{UI}/(4C_2) \quad \text{Expression 11}$$

In addition, the volatile memory device 30-2 is a volatile memory device closest to (at the near end of) the controller 10 among the plurality of volatile memory devices 30-2, 30-4, 30-6, and 30-8.

If the round-trip time of the traveling waves and the reflected waves in the branch line 42-7 is set as $T_{STB7}$, and the input parasitic capacitance of the input buffer 311 of the volatile memory device 30-7 is set as $C_7$, the resistor circuit 312 of the volatile memory device 30-7 is configured so that a resistance value $R_7$ thereof satisfies Expression 12.

$$\sqrt{[(100-1)/\{(2\pi C_7(1/T_{STB7}))\}]}<R_7<T_{UI}/(4C_7) \quad \text{Expression 12}$$

In addition, the volatile memory device 30-7 is a volatile memory device farthest from (at the far end of) the controller 10 among the plurality of volatile memory devices 30-1, 30-3, 30-5, and 30-7.

The round-trip time of the traveling waves and the reflected waves in the branch line 42-8 is set as $T_{STB8}$, and the input parasitic capacitance of the input buffer 311 of the volatile memory device 30-8 is set as $C_8$, the resistor circuit 312 of the volatile memory device 30-8 is configured so that a resistance value $R_8$ thereof satisfies Expression 13.

$$\sqrt{[(100-1)/\{(\pi C_8(1/T_{STB8}))\}]}<R_9<T_{UI}/(4C_8) \quad \text{Expression 13}$$

In addition, the volatile memory device 30-8 is a volatile memory device farthest from (at the far end of) the controller 10 among the plurality of volatile memory devices 30-2, 30-4, 30-6, and 30-8.

Figure 4:
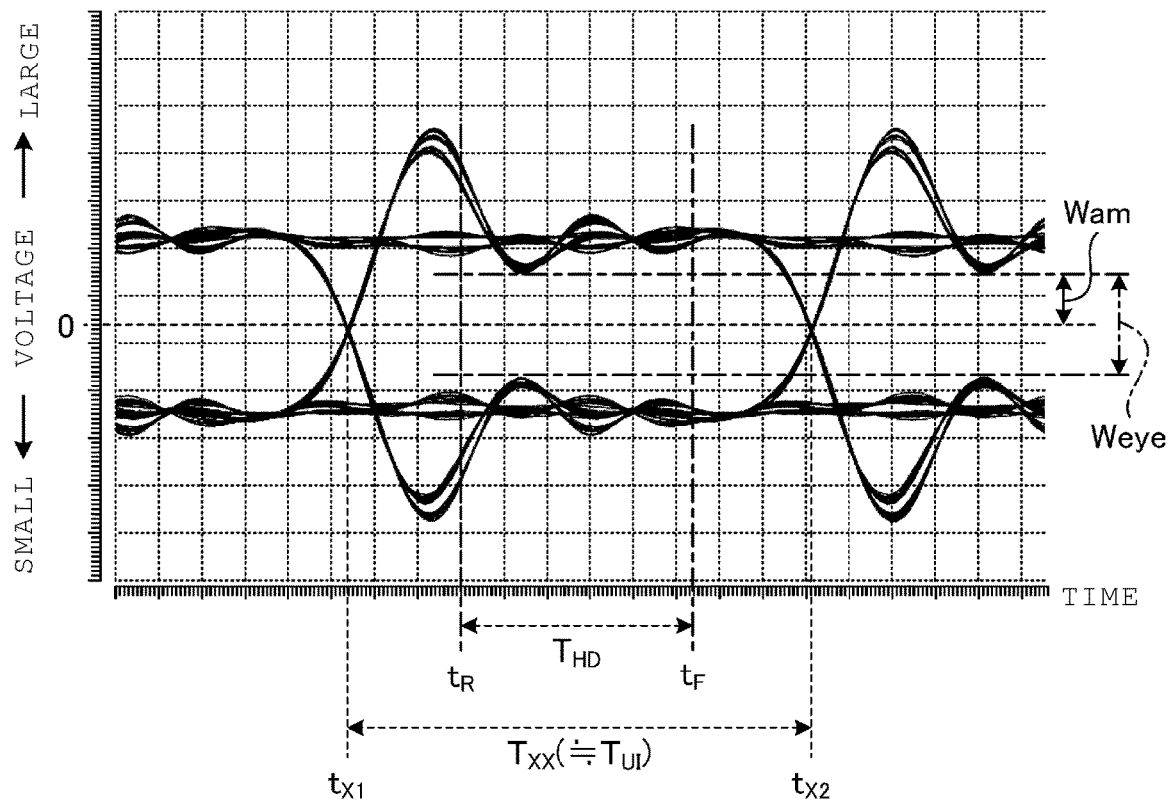
FIG. 4 is a diagram to explain a method of evaluating waveform qualities according to the embodiment.

Next, the waveform qualities of combined waves including the traveling waves and the reflected waves are described with reference to FIG. 4. In FIG. 4, the vertical axis represents the voltage level, and the horizontal axis represents time. FIG. 4 is a diagram illustrating a method of evaluating waveform qualities. FIG. 4 is a waveform diagram illustrating a voltage waveform for near a period $T_{UI}$ of 1 UI, which is obtained by collecting voltage waveforms of signals of combined waves for a plurality of UIs.

As illustrated in FIG. 4, the period $T_{UI}$ of 1 UI is substantially equal to a period $T_{XX}$ from a timing $t_{X1}$ when signal waveforms for the plurality of UIs intersect with each other to another timing $t_{X2}$ when signal waveforms for the plurality of UIs intersect with each other. Here, the reference for capturing signals is a clock, and thus strictly speaking, the period $T_{UI}$ of 1 UI is defined from an interval between intersection timings of clock waveforms. A rising edge timing $t_R$ is set as a timing when $T_{XX}/4$ (≈$T_{UI}/4$) elapses from the timing $t_{X1}$, and a falling edge timing $t_F$ is a timing before $T_{UI}/4$ from the timing $t_{X2}$. The period from the rising edge timing $t_R$ to the falling edge timing $t_F$ has the length of $T_{UI}/2$, and can be regarded as a data storage period $T_{HD}$.

The waveform qualities of the combined waves including the traveling waves and the reflected waves are evaluated by a minimum opening amplitude Weye of an eye pattern during the data storage period $T_{HD}$. The minimum opening amplitude Weye is a minimum height of an opening in the eye pattern in the voltage direction, and may be referred to as a minimum opening height. The minimum opening amplitude Weye of the eye pattern is regarded as a minimum value of the voltage difference between the amplitude level on the H level side and the amplitude level on the L level side. As the minimum opening amplitude Weye of the eye pattern during the data storage period $T_{HD}$ is larger, the signal waveform increases the voltage amplitude margin, and thus waveform qualities become better.

In addition, the method of evaluating the waveform qualities is not limited to the method using the minimum opening amplitude Weye. For example, the method of evaluating the waveform qualities may use a minimum voltage amplitude absolute value Wam during the data storage period $T_{HD}$. If the minimum voltage amplitude absolute value Wam is equal to or larger than a certain threshold value (for example, a threshold value corresponding to an amplitude threshold value Wth (see FIG. 5)), it can be regarded that the waveform qualities satisfy required specifications.

Figure 5:
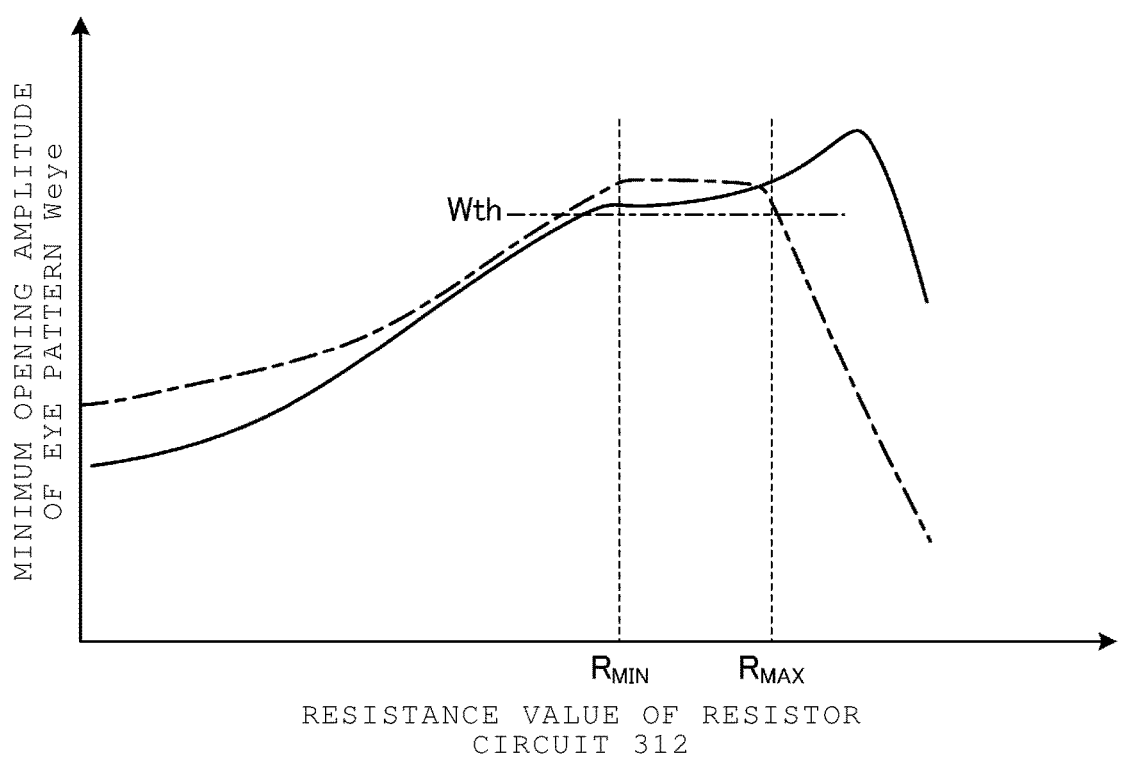
FIG. 5 is a diagram illustrating a change of waveform qualities in accordance with a resistance value of a resistance circuit in the embodiment.

Next, a result of the evaluation by the method of evaluating waveform qualities illustrated in FIG. 4 is illustrated in FIG. 5. FIG. 5 is a diagram illustrating a change in the waveform qualities in accordance with the resistance value of the resistor circuit 312. In FIG. 5, as the required level of the minimum opening amplitude Weye of the eye pattern of the combined wave, the amplitude threshold value Wth or more is exemplified.

In FIG. 5, with respect to the volatile memory device 30-1 at the near end, a result obtained by evaluating the change in the waveform qualities in accordance with the resistance value R1 of the resistor circuit 312 is illustrated with a solid line. As illustrated in FIG. 5, if the resistance value R1 of the resistor circuit 312 at the near end is set to satisfy Expression 10, the minimum opening amplitude Weye of the eye pattern of the combined wave becomes Wth or more, so that the waveform qualities can satisfy the required specifications.

In FIG. 5, with respect to the volatile memory device 30-7 at the far end, a result obtained by evaluating the change of waveform qualities in accordance with the resistance value $R_7$ of the resistor circuit 312 is illustrated with an alternate long and short dash line. As illustrated in FIG. 5, if the resistance value $R_7$ of the resistor circuit 312 at the far end is configured to satisfy Expression 12, the minimum opening amplitude Weye of the eye pattern of the combined wave becomes Wth or more, so that the waveform qualities can satisfy the required specifications.

As described above, in the memory system 1 according to the embodiment, the volatile memory device 30 connected to the controller 10 via the main line 41 and the branch line 42 includes the resistor circuit 312. The resistor circuit 312 is located between the branch line 42 and the input buffer 311. The resistor circuit 312 has a resistance value that is set in accordance with the input parasitic capacitance of the input buffer 311. For example, if the round-trip time of the traveling waves and the reflected waves in the branch line 42 is set as $T_{STB}$, the input parasitic capacitance of the input buffer is set as C, and the unit period of the waveform process of the signal is set as $T_{UI}$, the resistance value R of the resistor circuit 312 satisfies $\sqrt{[(100-1)/\{2\pi C(1/T_{STB})\}]} < R < T_{UI}/(4C)$. Accordingly, the resistor circuit 312 can function as the damping resistor. Accordingly, the reflected wave at the input node of the input buffer 311 during the signal transmission can be attenuated by the resistor circuit 312. Accordingly, while the requirements of the mounting area on the substrate 2 are satisfied, the signal can be effectively transmitted from the controller 10 to the volatile memory device 30.

Figure 6:
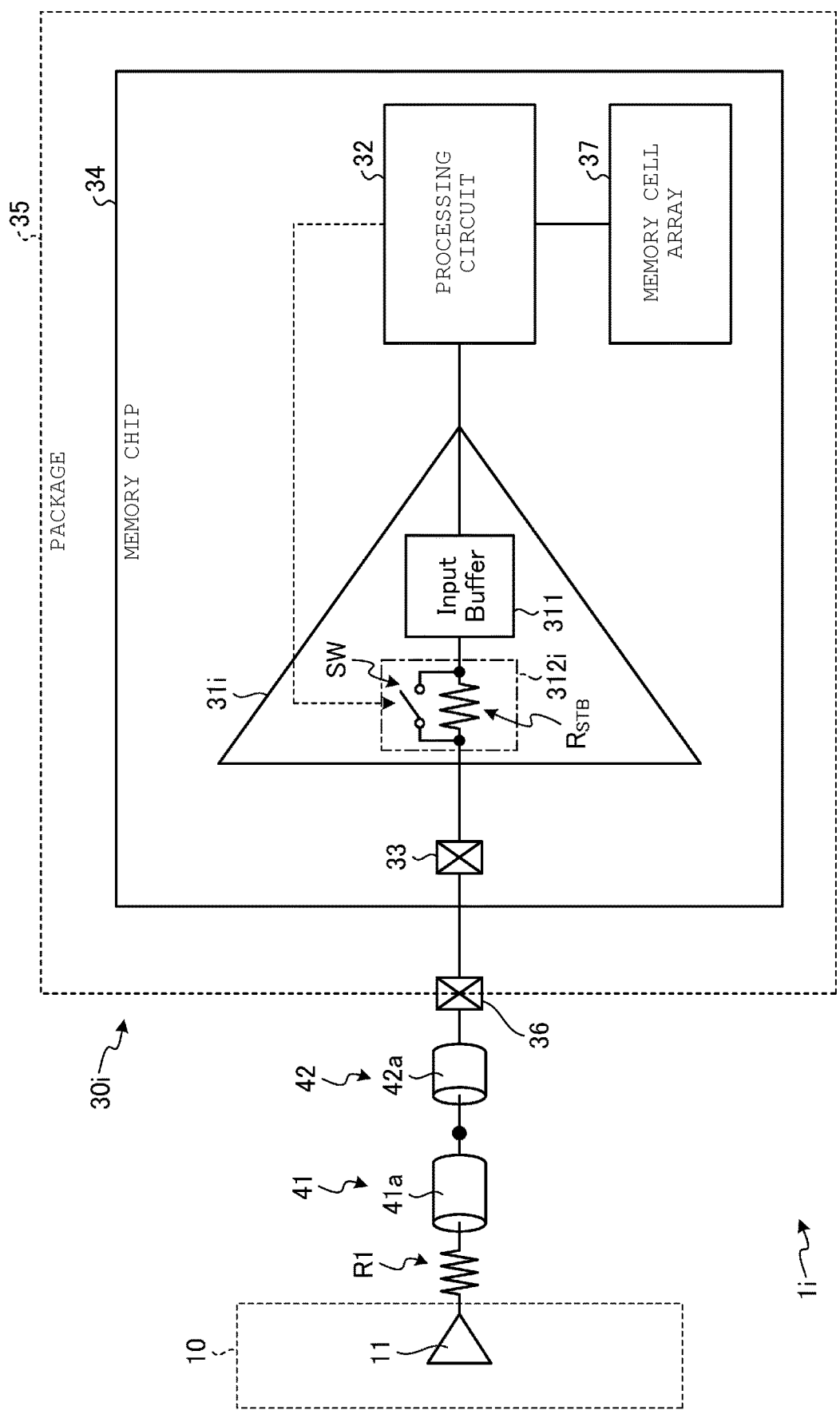
FIG. 6 is a diagram illustrating a configuration of a volatile memory device according to a first modification of the embodiment.

In addition, according to a first modification, as illustrated in FIG. 6, in a memory system 1i, a resistor circuit 312i in each volatile memory device 30i may be configured to have a variable resistance value. FIG. 6 is a diagram illustrating a configuration of the volatile memory device 30i according to the first modification of the embodiment.

As illustrated in FIG. 6, an input circuit 31i of each volatile memory device 30i includes the resistor circuit 312i instead of the resistor circuit 312 (see FIG. 3). The resistor circuit 312i has the resistor $R_{STB}$ and a switch SW. The switch SW is connected to the resistors $R_{STB}$, in parallel. The switch SW includes a first end that is connected to the first end of the resistor $R_{STB}$, a second end that is connected to the second end of the resistor $R_{STB}$, and a control terminal that is connected to the processing circuit 32. The switch SW is an example of a switching element, and is configured, for example, with a transistor.

In this case, the controller 10 may transmit a control signal that sets a variable resistance value of the resistor circuit 312i to the volatile memory device 30i. In the volatile memory device 30i, if the processing circuit 32 receives the control signal from the controller 10 via the input circuit 31i, the resistance value of the resistor circuit 312i is set according to the control signal.

For example, the processing circuit 32 turns on and off the switch SW according to the control signal from the controller 10. If the control signal indicates a resistance value of zero, the processing circuit 32 turns on the switch SW to cause the resistance value of the resistor circuit 312i to be approximately zero. If the control signal indicates a resistance value of $R_{STB}$, the processing circuit 32 turns off the switch SW to cause the resistance value of the resistor circuit 312i to be $R_{STB}$.

Accordingly, the resistor circuit 312i in each volatile memory device 30i is configured to have a variable resistance value. Accordingly, the resistance value of the resistor circuit 312i can be changed according to the resistance value required as the damping resistor.

Figure 7:
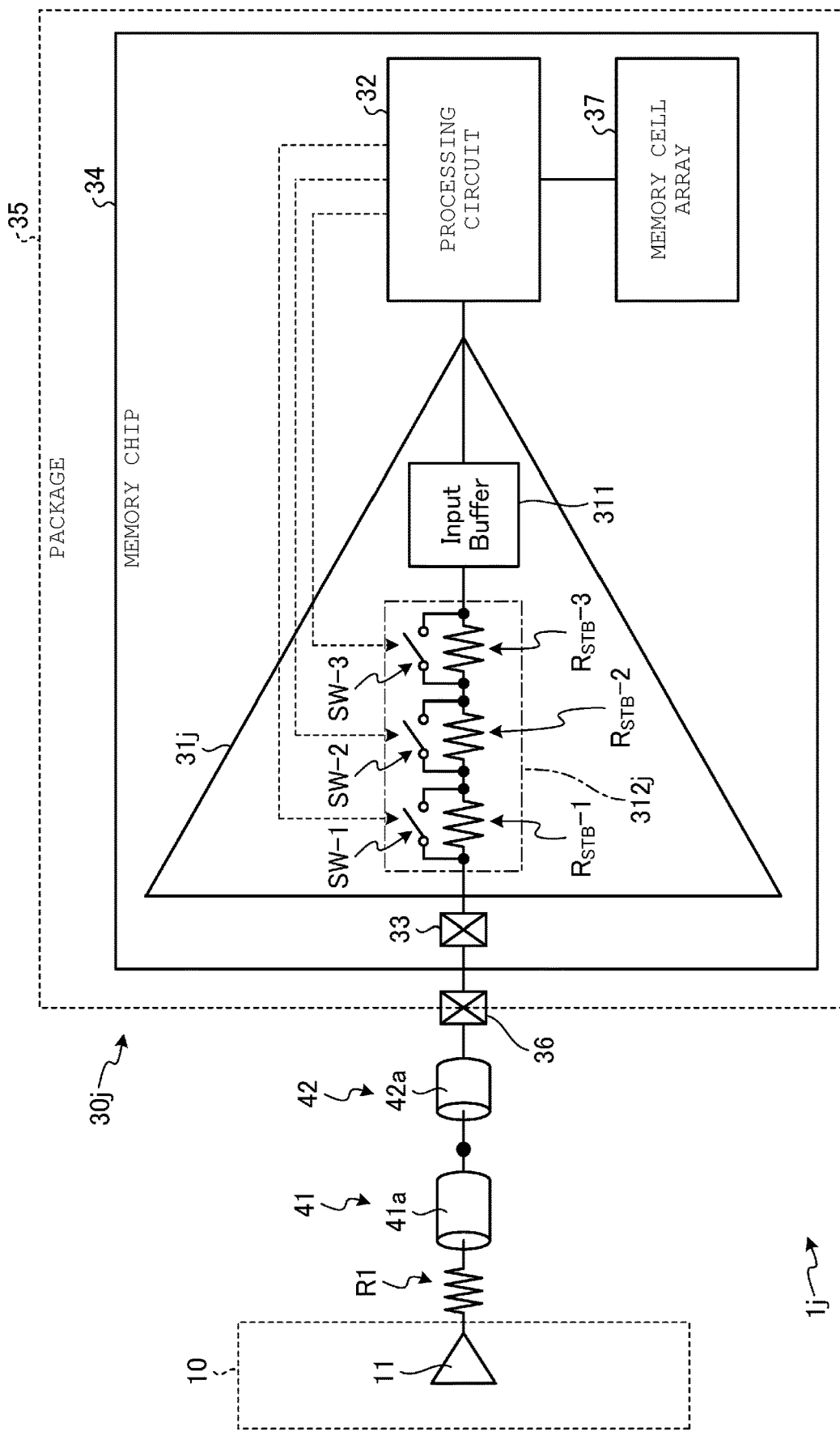
FIG. 7 is a diagram illustrating a configuration of a volatile memory device according to a second modification of the embodiment.

Alternatively, according to a second modification, as illustrated in FIG. 7, in a memory system 1j, a resistor circuit 312j in each volatile memory device 30j may be configured to have a resistance value that is variable in a multi-step manner. FIG. 7 is a diagram illustrating a configuration of the volatile memory device 30j according to the second modification of the embodiment.

As illustrated in FIG. 7, an input circuit 31j of each volatile memory device 30j includes the resistor circuit 312j instead of the resistor circuit 312 (see FIG. 3). The resistor circuit 312j includes a plurality of resistors $R_{STB}$-1 to $R_{STB}$-3 and the plurality of switches SW (SW-1 to SW-3). The plurality of resistors $R_{STB}$-1 to $R_{STB}$-3 are connected to each other in series, between the electrode 33 and the input node of the input buffer 311. The plurality of switches SW-1 to SW-3 correspond to the plurality of resistors $R_{STB}$-1 to $R_{STB}$-3, respectively. Each switch SW is connected to the corresponding resistor $R_{STB}$ in parallel. Each switch SW includes a first end that is connected to the first end of the corresponding resistor $R_{STB}$, a second end that is connected to the second end of the corresponding resistor $R_{STB}$, and a control terminal that is connected to the processing circuit 32. Each switch SW is an example of the switching element, and is configured, for example, with the transistor.

In this case, the controller 10 may transmit a control signal that sets a variable resistance value of the resistor circuit 312*j* to the volatile memory device 30*j*. In the volatile memory device 30*j*, if the processing circuit 32 receives the control signal from the controller 10 via the input circuit 31*j*, the resistance value of the resistor circuit 312*j* is set according to the control signal.

For example, the processing circuit 32 turns on and off the plurality of switches SW-1 to SW-3 according to the control signal from the controller 10. If the control signal indicates the resistance value of zero, the processing circuit 32 turns on three switches SW to cause the resistance value of the resistor circuit 312*j* to be approximately zero. If the control signal indicates the resistance value $R_{STB}$, the processing circuit 32 turns off one switch SW and turns on two switches SW to cause the resistance value of the resistor circuit 312*j* to be $R_{STB}$. If the control signal indicates a resistance value $2R_{STB}$, the processing circuit 32 turns off two switches SW and also turns on one switch SW to cause the resistance value of the resistor circuit 312*j* to be $2R_{STB}$. If the control signal indicates a resistance value $3R_{STB}$, the processing circuit 32 turns off three switches SW to cause the resistance value of the resistor circuit 312*j* to be $3R_{STB}$.

In this manner, the resistor circuit 312*j* in each volatile memory device 30*j* is configured to have a resistance value that is variable in a multi-step manner. Accordingly, the resistance value of the resistor circuit 312*j* can be changed in a multi-step manner according to the resistance value required as the damping resistor.

Figure 8:
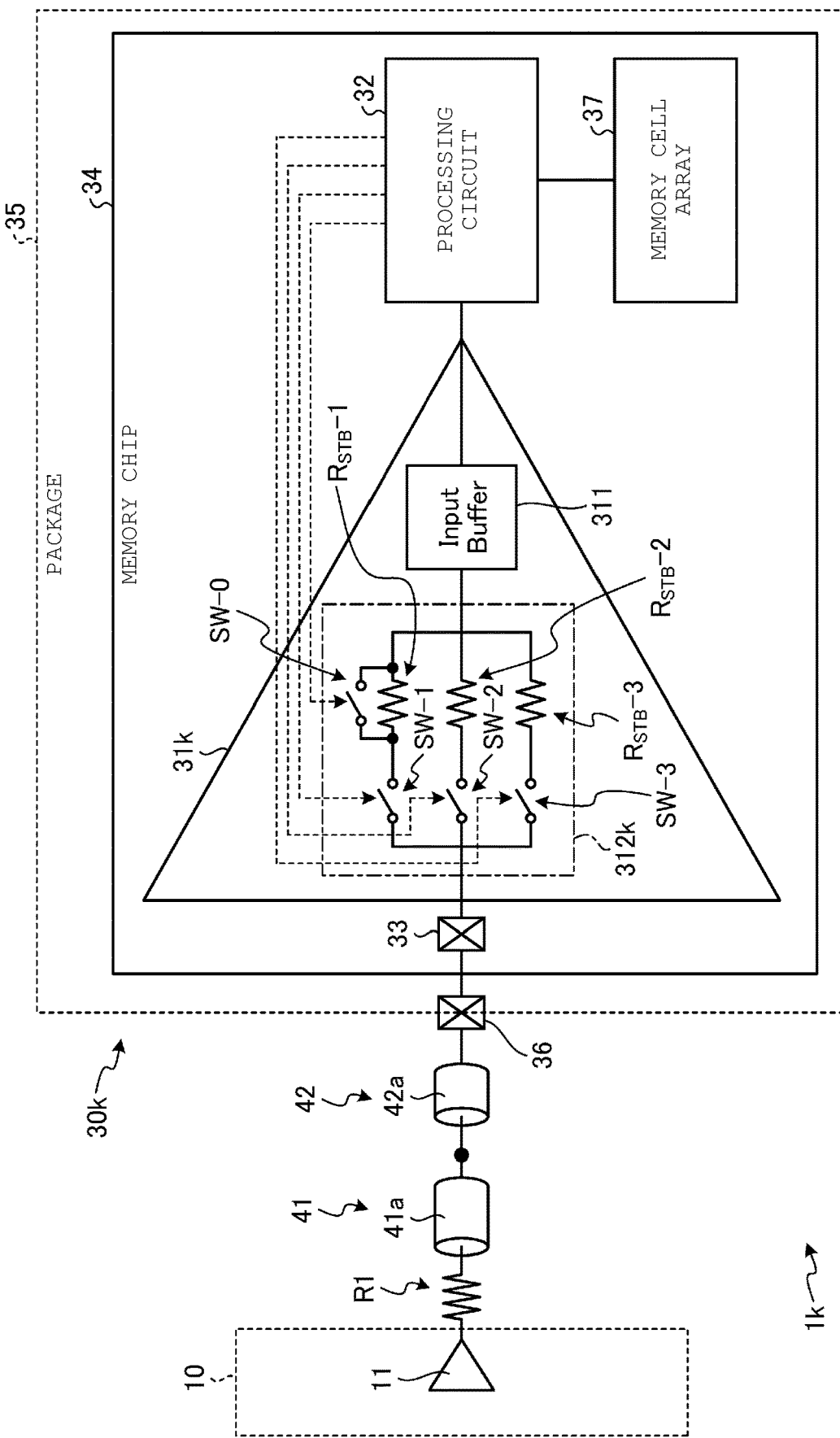
FIG. 8 is a diagram illustrating a configuration of a volatile memory device according to a third modification of the embodiment.

Alternatively, according to a third modification, as illustrated in FIG. 8, in a memory system 1*k*, a resistor circuit 312*k* in each volatile memory device 30*k* may be configured to have a resistance value that is variable in a multi-step manner. FIG. 8 is a diagram illustrating a configuration of the volatile memory device 30*k* according to the third modification of the embodiment.

As illustrated in FIG. 8, an input circuit 31*k* of each volatile memory device 30*k* includes the resistor circuit 312*k* instead of the resistor circuit 312 (see FIG. 3). The resistor circuit 312*k* includes the plurality of resistors $R_{STB}$-1 to $R_{STB}$-3 and a plurality of switches SW-0 to SW-3. The plurality of resistors $R_{STB}$-3 to $R_{STB}$ are connected to each other in parallel between the electrode 33 and the input node of the input buffer 311. The switch SW-0 corresponds to the resistor $R_{STB}$-1. The plurality of switches SW-1 to SW-3 correspond to the plurality of resistors $R_{STB}$-1 to $RR_{STB}$-3, respectively. The switch SW-0 is connected to the corresponding resistor $R_{STB}$ in parallel. The plurality of switches SW-1 to SW-3 are respectively connected to the corresponding resistors $R_{STB}$ in series, between the electrode 33 and the input node of the input buffer 311. The switches SW-0 to SW-3 are examples of the switching elements and are configured, for example, with transistors.

The switch SW-0 includes a first end that is connected to the first end of the corresponding resistor $R_{STB}$, a second end that is connected to the second end of the corresponding resistor $R_{STB}$, and a control terminal connected to the processing circuit 32. Each of the plurality of switches SW-1 to SW-3 includes a first end that is connected to the electrode 33, a second end that is connected to the corresponding resistor $R_{STB}$, and a control terminal connected to the processing circuit 32.

In this case, the controller 10 may transmit a control signal that sets a variable resistance value of the resistor circuit 312*k* to the volatile memory device 30*k*. In the volatile memory device 30*k*, if the processing circuit 32 receives the control signal from the controller 10 via the input circuit 31*k*, the resistance value of the resistor circuit 312*k* is set according to the control signal.

For example, the processing circuit 32 turns on and off the plurality of switches SW-0 to SW-3 according to the control signal from the controller 10. If the control signal indicates the resistance value of zero, the processing circuit 32 turns on at least the switches SW-0 and SW-1 to cause the resistance value of the resistor circuit 312*k* to be approximately zero. If the control signal indicates the resistance value $R_{STB}$, the processing circuit 32 turns on and off the switches SW in any of the following combinations to cause the resistance value of the resistor circuit 312*k* to be $R_{STB}$. Examples of the on and off combination of each switch SW include (SW-0, SW-1, SW-2, SW-3)=(off, on, off, off), (off or on, off, on, off), or (off or on, off, off, on). If the control signal indicates a resistance value of $RR_{STB}/2$, the processing circuit 32 turns on and off switches SW in any of the following combinations to cause the resistance value of the resistor circuit 312*k* to be $R_{STB}/2$. Examples of the on and off combination of each switch SW include (SW-0, SW-1, SW-2, SW-3)=(off, on, on, off), (off, on, off, on), or (off or on, off, on, on). If the control signal indicates a resistance value of $R_{STB}/3$, the processing circuit 32 turns off the switch SW-0 and simultaneously turns on the switches SW-1 to SW-3 to cause the resistance value of the resistor circuit 312*k* to be $R_{STB}/3$.

In this manner, the resistor circuit 312*k* in each volatile memory device 30*k* is configured to have a resistance value that is variable in a multi-step manner. Accordingly, the resistance value of the resistor circuit 312*k* can be changed in a multi-step manner according to the resistance value required as the damping resistor.

Figure 9:
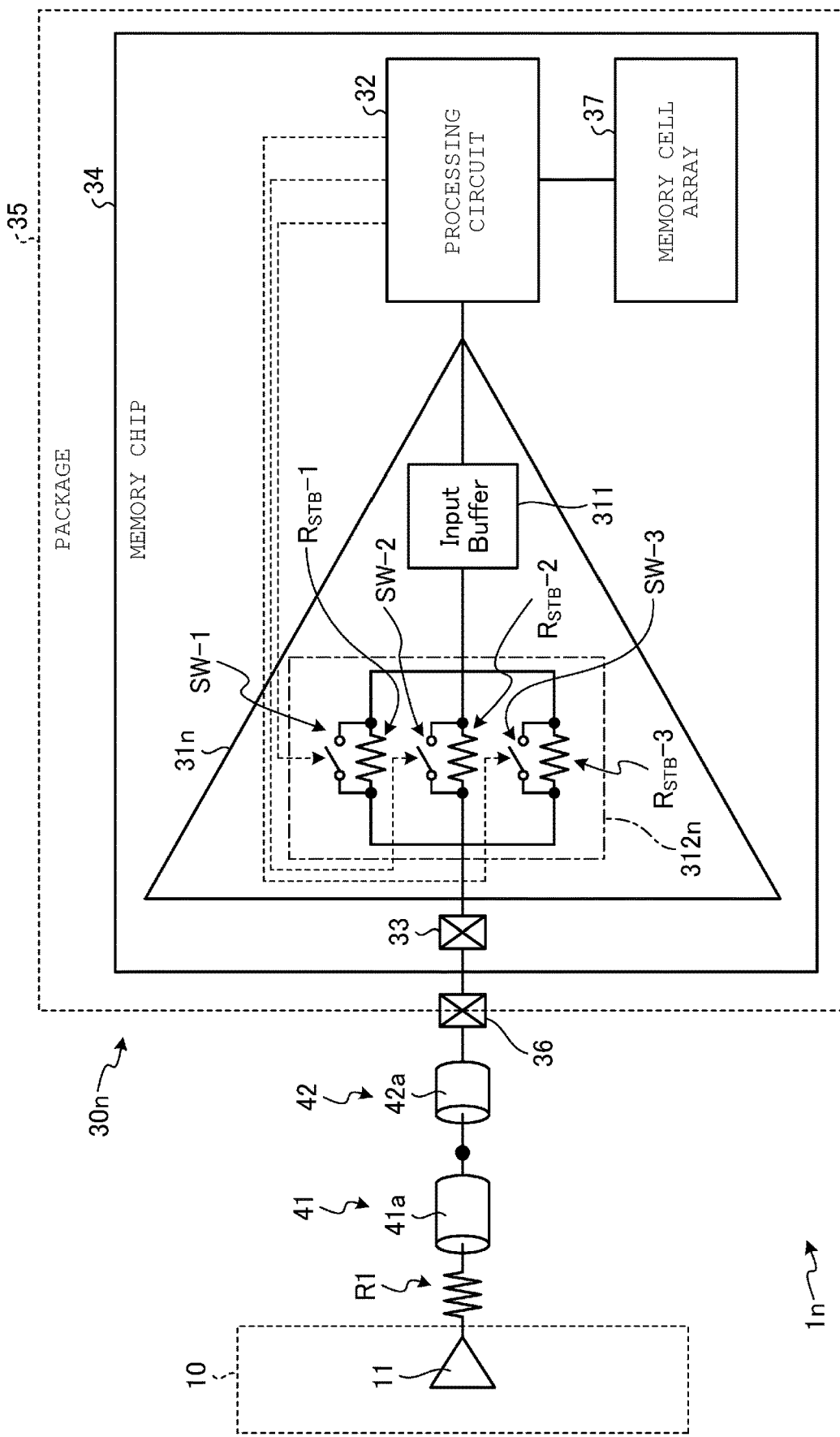
FIG. 9 is a diagram illustrating a configuration of a volatile memory device according to a fourth modification of the embodiment.

Alternatively, according to a fourth modification, as illustrated in FIG. 9, in a memory system 1*n*, a resistor circuit 312*n* in each volatile memory device 30*n* may be configured to have a resistance value that is variable in a multi-step manner. FIG. 9 is a diagram illustrating a configuration of the volatile memory device 30*n* according to the fourth modification of the embodiment.

As illustrated in FIG. 9, an input circuit 31*n* of each volatile memory device 30*n* includes the resistor circuit 312*n* instead of the resistor circuit 312 (see FIG. 3). The resistor circuit 312*n* includes the plurality of resistors $R_{STB}$-1 to $R_{STB}$-3 and the plurality of switches SW-1 to SW-3. The plurality of resistors $R_{STB}$-1 to $R_{STB}$-3 are connected to each other in parallel, between the electrode 33 and the input node of the input buffer 311. The plurality of switches SW-1 to SW-3 correspond to the plurality of resistors $R_{STB}$-1 to $R_{STB}$-1, respectively. Each of the switches SW-1 to SW-3 is connected to the corresponding resistor $R_{STB}$ in parallel, between the electrode 33 and the input node of the input buffer 311. Each of the switches SW-1 to SW-3 includes a first end that is connected to the first end of the corresponding resistor $R_{STB}$, a second end that is connected to the second end of the corresponding resistor $R_{STB}$, and a control terminal connected to the processing circuit 32.

In this case, the controller 10 may transmit a control signal that sets a variable resistance value of the resistor circuit 312n to the volatile memory device 30n. In the volatile memory device 30n, if the processing circuit 32 receives the control signal from the controller 10 via the input circuit 31n, the resistance value of the resistor circuit 312n is set according to the control signal.

For example, the processing circuit 32 turns on and off the plurality of switches SW-1 to SW-3 according to the control signal from the controller 10. If the control signal indicates the resistance value of zero, the processing circuit 32 turns on all of the switches SW-1 to SW-3 to cause the resistance value of the resistor circuit 312n to be approximately zero. If the control signal indicates the resistance value of $R_{STB}$, the processing circuit 32 turns off one switch SW and simultaneously turns on the other two switches SW to cause the resistance value of the resistor circuit 312n to be $R_{STB}$. If the control signal indicates the resistance value of $R_{STB}/2$, the processing circuit 32 turns off two switches SW and simultaneously turns on another one switch SW to cause the resistance value of the resistor circuit 312n to be $R_{STB}/2$. If the control signal indicates the resistance value of $R_{STB}/3$, the processing circuit 32 turns off all of the switches SW-1 to SW-3 to cause the resistance value of the resistor circuit 312n to be $R_{STB}/3$.

In this manner, the resistor circuit 312n in each volatile memory device 30n is configured to have a resistance value that is variable in a multi-step manner. Accordingly, the resistance value of the resistor circuit 312n can be changed in a multi-step manner according to the resistance value required as the damping resistor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a controller;
   a main line connected to the controller and including a first node and a second node that is farther from or closer to the controller than the first node;
   a first branch line connected to the first node of the main line;
   a second branch line connected to the second node of the main line;
   a first memory device connected to the main line via the first branch line; and
   a second memory device connected to the main line via the second branch line, wherein
   the first memory device includes:
      a memory cell array;
      a processing circuit configured to control the memory cell array;
      an input buffer through which a signal from the controller is transmitted to the processing circuit; and
      a resistor circuit connected between the input buffer and the first branch line, the resistor circuit having a resistance value corresponding to a parasitic capacitance of the input buffer.

2. The memory system according to claim 1, wherein the resistance value of the resistor circuit is invariable.

3. The memory system according to claim 1, wherein the resistance value of the resistor circuit is variable.

4. The memory system according to claim 3, wherein the resistor circuit includes a first resistor and a first switching element connected in parallel between the input buffer and the first branch line.

5. The memory system according to claim 4, wherein the resistor circuit includes a second resistor and a second switching element connected in parallel between the input buffer and the first branch line and in series with the parallel connection of the first resistor and the first switching element.

6. The memory system according to claim 5, wherein the resistor circuit includes a third resistor and a third switching element connected in parallel between the input buffer and the first branch line and in series with the parallel connection of the second resistor and the second switching element.

7. The memory system according to claim 4, wherein the resistor circuit includes a second resistor and a second switching element connected in series between the input buffer and the first branch line, the serial connection of the second resistor and the second switching element being connected in parallel to the parallel connection of the first resistor and the first switching element.

8. The memory system according to claim 7, wherein the resistor circuit includes a third resistor and a third switching element connected in series between the input buffer and the first branch line, the serial connection of the third resistor and the third switching element being connected in parallel to the serial connection of the second resistor and the second switching element.

9. The memory system according to claim 4, wherein the resistor circuit includes a second resistor and a second switching element connected in parallel between the input buffer and the first branch line, the parallel connection of the second resistor and the second switching element being connected in parallel to the parallel connection of the first resistor and the first switching element.

10. The memory system according to claim 9, wherein the resistor circuit includes a third resistor and a third switching element connected in parallel between the input buffer and the first branch line, the parallel connection of the third resistor and the third switching element being connected in parallel to the parallel connection of the second resistor and the second switching element.

11. The memory system according to claim 3, wherein the processing circuit is configured to receive a control signal from the controller via the input buffer, and control the resistance value of the resistor circuit based on the control signal.

12. The memory system according to claim 1, wherein the resistance value of the resistance circuit satisfies $\sqrt{[(100-1)/\{2\pi C_1(1/T_1)\}]} < R_1 < T_U/(4C_1)$, where $R_1$ is the resistance value of the resistance circuit, $T_1$ is a round-trip time of a traveling wave and a reflected wave of the signal transmitted in the first branch line, $C_1$ is the parasitic capacitance of the input buffer, and $T_U$ is a unit period of waveform processing of the signal.

13. The memory system according to claim 1, wherein the first memory device comprises a memory chip in which the memory cell array, the processing circuit, the input buffer, and the resistor circuit are disposed.

14. The memory system according to claim 1, wherein the main line, the first branch line, and the second branch line configure a fly-by topology.

15. The memory system according to claim 1, wherein the second memory device includes:
 a second memory cell array;
 a second processing circuit configured to control the second memory cell array;
 a second input buffer through which a signal from the controller is transmitted to the second processing circuit; and
 a second resistor circuit connected between the second input buffer and the second branch line, the second resistor circuit having a resistance value corresponding to a parasitic capacitance of the second input buffer.

16. The memory system according to claim 1, wherein each of the first memory device and the second memory device is a volatile memory.

17. A memory system comprising:
 a controller;
 a plurality of volatile memory devices; and
 a signal wiring connected between the controller and the volatile memory devices, the signal wiring configuring a fly-by topology, wherein
 each of the volatile memory devices includes:
  a memory cell array;
  a processing circuit configured to control the memory cell array;
  an input buffer through which a signal from the controller is transmitted to the processing circuit; and
  a resistor circuit connected between the input buffer and the signal wiring, the resistor circuit having a resistance value corresponding to a parasitic capacitance of the input buffer.

18. The memory system according to claim 17, wherein the resistance value of the resistor circuit in at least one of the volatile memory devices is variable.

19. The memory system according to claim 17, wherein the resistance value of the resistor circuit in each of the volatile memory devices is variable.

20. The memory system according to claim 17, wherein each of the volatile memory devices comprises a memory chip in which the memory cell array, the processing circuit, the input buffer, and the resistor circuit are provided.

* * * * *